United States Patent
Lee et al.

(10) Patent No.: US 10,395,915 B2
(45) Date of Patent: Aug. 27, 2019

(54) NOZZLE ASSEMBLY, SUBSTRATE TREATMENT APPARATUS INCLUDING THE NOZZLE ASSEMBLY, AND METHOD OF TREATING SUBSTRATE USING THE ASSEMBLY

(71) Applicant: Semes Co., Ltd., Cheonan-si, Chungcheongnam-do (KR)

(72) Inventors: Se Won Lee, Cheonan-si (KR); Yong Hee Lee, Cheonan-si (KR); Jae Yong Kim, Cheonan-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 878 days.

(21) Appl. No.: 14/190,534

(22) Filed: Feb. 26, 2014

(65) Prior Publication Data
US 2014/0238443 A1    Aug. 28, 2014

(30) Foreign Application Priority Data

Feb. 28, 2013  (KR) .................. 10-2013-0022310
May 22, 2013  (KR) .................. 10-2013-0057839

(51) Int. Cl.
  *H01L 21/02*  (2006.01)
  *H01L 21/67*  (2006.01)
(52) U.S. Cl.
  CPC .... *H01L 21/02052* (2013.01); *H01L 21/6708* (2013.01); *H01L 21/67051* (2013.01)
(58) Field of Classification Search
  CPC .................................... H01L 21/67051
  USPC .......................................................... 134/21
  See application file for complete search history.

(56) References Cited

U.S. PATENT DOCUMENTS

| | | | |
|---|---|---|---|
| 6,503,837 B2 * | 1/2003 | Chiou | H01L 21/67051 134/1.1 |
| 7,927,657 B2 * | 4/2011 | Kobayashi | B05D 1/005 118/320 |
| 2007/0256633 A1 * | 11/2007 | Lin | H01L 21/6708 118/52 |

FOREIGN PATENT DOCUMENTS

| | | |
|---|---|---|
| JP | 2007523463 A | 8/2007 |
| JP | 2008047637 A | 2/2008 |
| JP | 2009158924 A | 7/2009 |
| JP | 2009200193 A | 9/2009 |
| KR | 20100042232 A | 4/2010 |
| KR | 101213967 | 6/2011 |
| KR | 20110116471 A | 10/2011 |
| KR | 20110133280 A | 12/2011 |

OTHER PUBLICATIONS

KR 10-2011-0116471 google translation from Korean Patent Office.*

* cited by examiner

*Primary Examiner* — Rita P Adhlakha
(74) *Attorney, Agent, or Firm* — Harness, Dickey & Pierce, P.L.C.

(57) ABSTRACT

Provided is a substrate treatment apparatus. The apparatus includes a chuck supporting a substrate and being rotatable, a container surrounding the chuck and collecting chemicals scattered due to rotations of the substrate, and a first spray nozzle spraying the chemicals to the substrate.

22 Claims, 11 Drawing Sheets

|  | Operations of Process | Time of Process(S) | Rotational Speed(RPM) |
|---|---|---|---|
| S10 | Firstly Strip | 10 | 250(150~300) |
| S20 | Replace Nozzle | 1~2 | 20~50 |
| S30 | Secondarily Strip | 50 | 250(150~300) |
| S40 | Thirdly Strip | 30 | 1000(500~1500) |
| S50 | Substitute DI Water | 30 | 1500(1000~1800) |
| S60 | Clean by Spraying DI Water | 45 | 1000(500~1500) |
| S70 | Clean Using DI Water | 5 | 1000(500~1500) |
| S80 | Dry | 20 | 1500(1000~1800) |

NOZZLE ASSEMBLY, SUBSTRATE TREATMENT APPARATUS INCLUDING THE NOZZLE ASSEMBLY, AND METHOD OF TREATING SUBSTRATE USING THE ASSEMBLY

CROSS-REFERENCE TO RELATED APPLICATIONS

This U.S. non-provisional patent application claims priority under 35 U.S.C. § 119 of Korean Patent Application Nos. 10-2013-0022310, filed on Feb. 28, 2013, and 10-2013-0057839, filed on May 22, 2013, the entire contents of which are hereby incorporated by reference.

BACKGROUND OF THE INVENTION

The present invention disclosed herein relates to a substrate treatment apparatus, and more particularly, to a substrate treating apparatus including a nozzle assembly.

Generally, in a process of manufacturing flat panel display devices or semiconductors, as a process of treating glass substrates or wafers, there are performed various processes such as a photoresist (PR) coating process, a developing process, an etching process, and an ashing process.

In each process, a wet cleaning process using chemicals or deionized (DI) water is performed to remove various kinds of pollutants attached to a substrate and a drying process for drying residual chemicals or DI water on a surface of the substrate is performed.

Korean Patent Publication Application No. 10-2011-0116471 discloses a cleaning apparatus. The cleaning apparatus includes a cleaning solution supplying nozzle for supplying a cleaning solution for cleaning, an organic solvent injection nozzle supplying an organic solvent and a drying gas injection nozzle injecting a drying gas for drying.

The cleaning solution is a liquid, is provided to the substrate, and removes a film applied on the substrate through a chemical reaction. According to a method described above, an amount of the cleaning solution is large, thereby increasing costs for performing processes. Also, it is not easy to remove a crust layer formed on a PR film using an etching process.

CITED INVENTION

Cited Document: Korean Patent Application Publication No. 10-2011-0116471

SUMMARY OF THE INVENTION

The present invention provides a substrate treatment apparatus capable of reducing costs for performing a treatment process using chemicals.

The present invention also provides a substrate treatment apparatus capable of effectively removing a film applied on a substrate.

The present invention also provides a substrate treatment apparatus capable of increasing reusability of chemicals.

Embodiments of the present invention provide substrate treatment apparatuses including a chuck supporting a substrate and being rotatable, a container surrounding the chuck and collecting chemicals scattered due to rotations of the substrate, and a first spray nozzle spraying the chemicals to the substrate.

In some embodiments, the apparatus may further include an arm mounted with the first spray nozzle on a fore-end thereof and a second spray nozzle mounted on the fore-end of the arm together with the first spray nozzle and spraying chemicals identical to the chemicals to the substrate.

In other embodiments, the first spray nozzle and the second spray nozzle may be disposed on a straight line to allow ejecting lines of the chemicals to be on the same straight line.

In still other embodiments, the first spray nozzle and the second spray nozzle may be alternately disposed to allow ejecting lines of the chemicals to be on different straight lines.

In even other embodiments, the first spray nozzle may spray the chemicals to an ejection area corresponding to or smaller than a radius of the substrate.

In yet other embodiments, the first spray nozzle may be disposed to allow an incidence angle of the chemicals sprayed to the substrate to be perpendicular to a top surface of the substrate.

In further embodiments, the first spray nozzle may be disposed to allow an incidence angle of the chemicals sprayed to the substrate to form an acute angle with a top surface of the substrate.

In still further embodiments, the apparatus may further include a swing nozzle ejecting chemicals identical to the chemicals to the substrate and a swing nozzle driver allowing the swing nozzle to swing above a top of the substrate while the chemicals are being ejected.

In even further embodiments, the container may include a first collecting barrel surrounding the chuck and forming a first inlet having a ring shape and a second collecting barrel surrounding the first collecting barrel and forming a second inlet having a ring shape above the first inlet. The apparatus may further include a collecting line connected to the first collecting barrel and collecting chemicals flowing into the first collecting barrel to reuse the chemicals, a waste liquid line connected to the second collecting barrel and disusing chemicals flowing into the second collecting barrel, and a controller of elevating any one of the chuck and the container to allow the chemicals sprayed from the first spray nozzle to flow through the first inlet and to allow the chemicals injected from the swing nozzle to flow through the second inlet.

In yet further embodiments, the apparatus may further include an exhaust pipe sucking and exhausting outwards fumes occurring in the container. Herein, sucking pressure of the exhaust pipe may be greater in a process of spraying the chemicals from the spray nozzle than in a process of spraying the chemicals from the swing nozzle.

In much further embodiments, the apparatus may further include a pre-dispenser located outside the container, to which the spray nozzle preliminarily ejects the chemicals before ejecting the chemicals to the substrate. Herein, the pre-dispenser may include a housing formed with a space therein and formed with a hole, into which the spray nozzle is inserted, on a top thereof, a mesh provided in the housing and dispersing a hitting force of the injected chemicals, a discharge line discharging outwards chemicals ejected into the housing, and an exhaust port exhausting outwards fine particles of the residual chemicals in the housing.

In other embodiments of the present invention, methods of treating a substrate include firstly stripping, in which a swing nozzle swings above the rotating substrate and ejects chemicals as a liquid thereto, secondarily stripping, in which a spray nozzle firstly sprays chemicals identical to the chemicals to above the rotating substrate, and cleaning, in which the residual chemicals on the substrate are removed by supplying deionized (DI) water to the rotating substrate.

In some embodiments, the method may further include thirdly stripping, after the secondarily stripping, in which the spray nozzle secondarily sprays chemicals identical to the chemicals to above the rotating substrate. Herein, a rotational speed of the substrate in the thirdly stripping may be higher than in the secondarily stripping.

In other embodiments, the method may further include preliminarily ejecting a certain amount of chemicals from a pre-dispenser before the spray nozzle ejects the chemicals to the substrate.

In still other embodiments, the container may include a first inlet having a ring shape surrounding a chuck and a second inlet having a ring shape formed above the first inlet. Herein, the chemicals ejected to the substrate in the firstly stripping may flow through the second inlet and the chemicals ejected to the substrate flow through the secondarily stripping flow through the first inlet. Herein, the chemicals flowing through the first inlet may be collected through a collecting line, and the chemicals flowing through the second inlet may be discarded through a waste liquid line.

In even other embodiments, an exhaust pipe connected to the container may suck and exhaust outwards mist occurring in the container, and sucking pressure of the exhaust pipe may be greater in the firstly stripping than in the secondarily stripping.

In yet other embodiments, the spray nozzle may be disposed to allow a longitudinal direction thereof to be perpendicular to a top surface of the substrate to eject the chemicals thereto.

In further embodiments, the spray nozzle may be disposed to allow a longitudinal direction thereof to be diagonally inclined to top and bottom thereof to eject the chemicals.

In still further embodiments, the spray nozzle may include a first spray nozzle and a second spray nozzle mounted on one arm, and the first spray nozzle and the second spray nozzle may eject chemicals to allow ejecting lines of the chemicals to be on the same straight line.

In even further embodiments, the spray nozzle may include a first spray nozzle and a second spray nozzle mounted on one arm, and the first spray nozzle and the second spray nozzle may eject chemicals to allow ejecting lines of the chemicals to be on different straight lines.

In still other embodiments of the present invention, nozzle assemblies include a swing nozzle supplying chemicals in a liquid state to a substrate, a swing nozzle arm mounted with the swing nozzle on a fore-end thereof and allowing the swing nozzle to swing, a spray nozzle spraying chemicals identical to the chemicals to the substrate, and a spray nozzle arm mounted with the spray nozzle on a fore-end thereof.

In some embodiments, the spray nozzle may include first and second spray nozzles mounted on the fore-end of the spray nozzle arm, and the first spray nozzle and the second spray nozzle may be disposed not to allow ejection areas of the chemicals to be overlapped.

In other embodiments, the spray nozzle may be disposed to allow an ejecting line of the chemicals to be perpendicular to a top surface of the substrate.

In still other embodiments, the spray nozzle may be disposed to allow an ejecting line of the chemicals to form an acute angle with a top surface of the substrate.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Hereinafter, embodiments of the present invention will be described in detail with reference to the attached drawings. The embodiments of the present invention may be modified into various forms, and the scope of the present invention is not limited to the following embodiments. The embodiments are provided to more perfectly explain the present invention to a person of ordinary skill in the art. Accordingly, shapes of elements in the drawings are exaggerated for more accurate descriptions.

Figure 1:
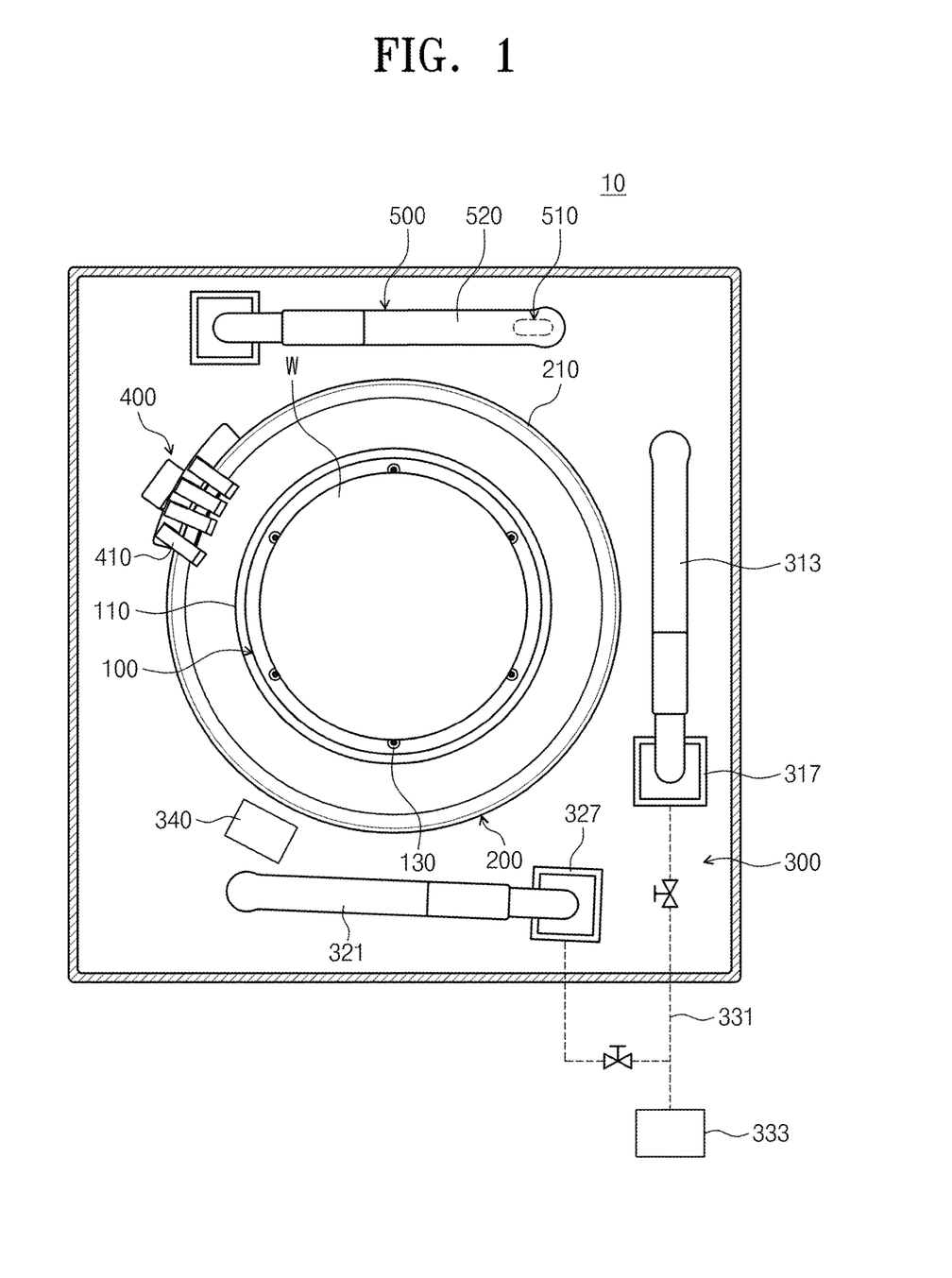
FIG. 1 is a top view of a substrate treatment apparatus according to an embodiment of the present invention.
Figure 2:
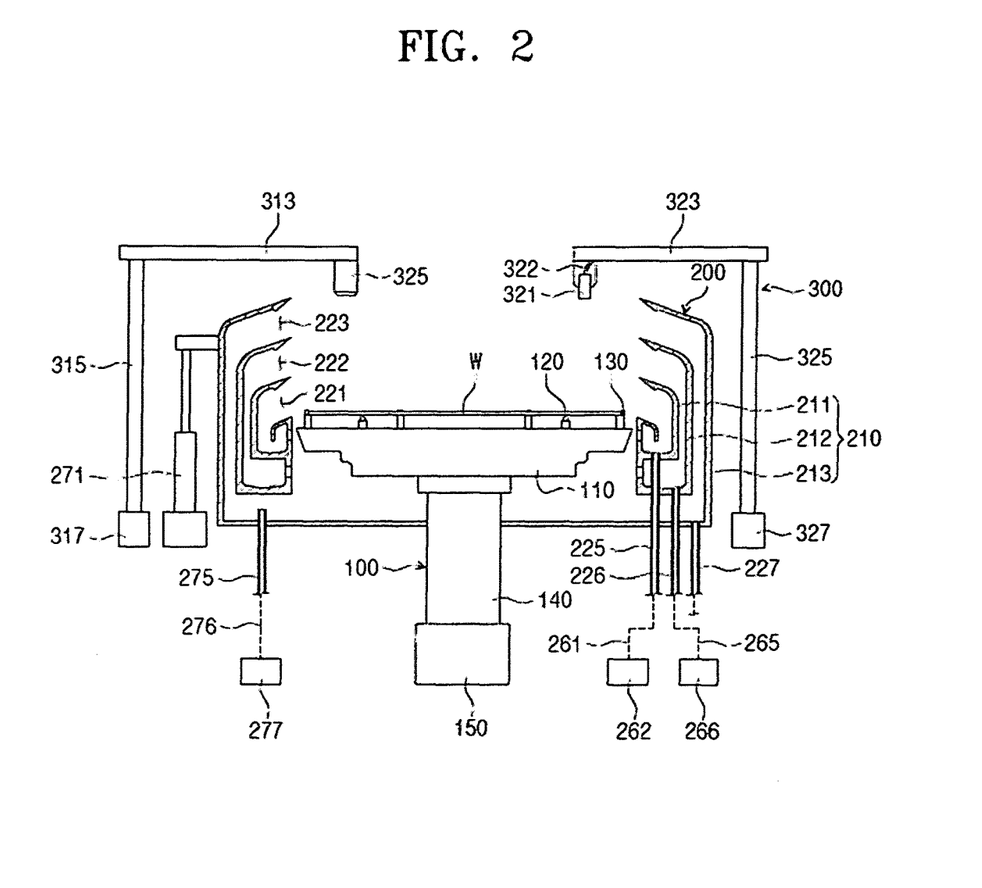
FIG. 2 is a cross-sectional view of the substrate treatment apparatus of FIG. 1.

FIG. 1 is a top view illustrating a substrate treatment apparatus 1 according to an embodiment of the present invention, and FIG. 2 is a cross-sectional view of the substrate treatment apparatus 1.

Referring to FIGS. 1 and 2, the substrate treatment apparatus 1 is provided for a substrate cleaning process.

The cleaning process may be performed on a substrate completed with an ashing process. The substrate treatment apparatus 10 includes a supporter 100, a chemical collector 200, a chemical supplier 300, a deionized (DI) water supplier 400, and a drying gas supplier 500.

The supporter 100 supports a substrate W provided for a treatment process. The chemical collector 200 collects chemicals scattered due to rotations of the substrate W. The chemical supplier 300 supplies the chemicals to the substrate W. The DI water supplier 400 supplies DI water to remove residual chemicals on the substrate W. The drying gas supplier 500 dries the substrate W by supplying a drying gas. Hereinafter, respective components will be described in detail.

The supporter 100 supports the substrate W. The supporter 100 includes a chuck 110, a supporting pin 120, a chucking pin 130, a supporting shaft 140, and a supporting shaft driver 150.

The chuck 110 is a circular plate having a certain thickness and has a radius greater than the substrate W. A top surface of the chuck 110 has a diameter greater than a bottom surface thereof. A side of the chuck 110 is inclined to allow the diameter of the chuck 110 to become gradually smaller from the top surface to the bottom surface.

The supporting pin 120 and the chucking pin 130 are provided on the top surface of the chuck 110. The supporting pin 120 protrudes upwards from the top surface of the chuck 110 and the substrate W is disposed on a top thereof. The supporting pin 120 is provided as a plurality thereof and separately disposed on the top surface of the chuck 110. The supporting pin 120 is provided at least three supporting different areas of the substrate W.

The chucking pin 130 protrudes upwards from the top surface of the chuck 110 and supports a side of the substrate W. The chucking pin 130 is provided as a plurality thereof disposed as a ring shape along an edge of the chuck 110. The chucking pins 130 prevent the substrate W from being separated a lateral direction of the chuck 110 by a centrifugal force occurring when the chuck 110 rotates. The chucking pins 130 may straightly move along a radial direction of the chuck 110. The chucking pins 130 straightly moves in a direction of receding from a center of the chuck 110 while loading or unloading the substrate W and straightly moves toward the center of the chuck 110 and supports the side of the substrate W while chucking the substrate W.

The supporting shaft 140 supports the chuck 110 below the chuck 110. The supporting shaft 140 is a hollow shaft and transmits a rotational force to the chuck 110. The supporting shaft driver 150 is provided on a bottom of the supporting shaft 140. The supporting shaft driver 150 generates a rotational force for rotating the supporting shaft 140 and the chuck 110. The supporting shaft driver 150 may control a rotational speed of the chuck 110.

The chemical collector 200 collects the chemicals supplied to the substrate W. The chemical collector 200 includes a container 210, a collecting line 261, a waste liquid line 265, an elevator 271, and an exhaust pipe 275.

The container 210 prevents the chemicals scattered due to rotations of the substrate W from being spattered outwards or prevents an outflow of fumes occurring during a process. The container 210 has an open top and is formed with a space for locating the chuck 110 therein.

The container 210 includes collecting barrels 211, 212, and 213 separating and collecting chemicals supplied to the substrate W according to process stages. In the embodiment, the collecting barrels 211, 212, and 213 are provided three. The respective collecting barrels are designated as a first collecting barrel 211, a second collecting barrel 212, and a third collecting barrel 213.

The first to third collecting barrels 211, 212, and 213 are ring-shaped barrels. The first collecting barrel 211 surrounds a circumference of the chuck 110, the second collecting barrel 212 surrounds a circumference of the first collecting barrel 211, and the third collecting barrel 213 surrounds a circumference of the second collecting barrel 212. The container 210 is formed with inlets 221, 222, and 223 by disposing the first to third collecting barrels 211, 212, and 213. The inlets 221, 222, and 223 have a ring-shape and are provided along the circumference of the chuck 110. The first collecting barrel 211 forms a first inlet 221. The second collecting barrel 212 forms a second inlet 222 above the first inlet 221. Also, the third collecting barrel 213 forms a third inlet 223 above the second inlet 222. The chemicals scattered due to rotations of the substrate W flow into any one of the inlets 221, 222, and 223 and are collected in the collecting barrels 211, 212, and 213.

Discharge pipes 225, 226, and 227 are provided on bottoms of the collecting barrels 211, 212, and 213. Ends of the discharge pipes 225, 226, and 227 flush with the bottoms of the collecting barrels 211, 212, and 213 and are provided as paths for discharging the chemicals collected in the collecting barrels 211, 212, and 213 outwards. The first collecting barrel 211 is provided with a first discharge pipe 225, the second collecting barrel 212 is provided with a second discharge pipe 226, and the third collecting barrel 213 is provided with a third discharge pipe 227.

The third collecting barrel 213 is additionally provided with the exhaust pipe 275 on the bottom thereof. The exhaust pipe 275 is located to allow an end thereof to be higher than the bottom of the third collecting barrel 213. The exhaust pipe 275 is provided as a path for exhausting outwards fumes occurring in the container 210. The exhaust pipe 275 is connected to a pump 277 through an exhaust line 276. The pump 277 applies vacuum pressure to the exhaust pipe 275. The vacuum pressure applied to the pump 277 may vary with process stages. Due to this, suction pressure of the exhaust pipe 275 for sucking the fumes differs.

The collecting line 261 connects the first discharge pipe 225 to a collecting tank 262. The chemicals flowing into the first discharge pipe 225 pass through the collecting line 261 and are stored in the collecting tank 262. The chemicals stored in the collecting tank 262 pass through a recycling process and are reused for the treatment process.

The waste liquid line 265 connects the second discharge pipe 226 to a waste liquid tank 266. The chemicals flowing into the second discharge pipe 226 pass through the waste liquid line 265 and are stored in the waste liquid tank 266. The chemicals stored in the waste liquid tank 266 are not reused and disused.

The elevator 271 transfers the container 210 up and down to control a height of the chuck 110 relative to the container 210. The elevator 271 lowers down the container 210 to allow the chuck 110 to protrude upwards from the container 210 while loading or unloading the substrate W onto or from the chuck 110. Also, during the process, the container 210 is elevated to allow the chemicals to be separated according to process stages and to flow into any one of the inlets 221, 222, and 223. The elevator 271 elevates the container 210 to allow the substrate W to be located at a height corresponding to any one of the inlets 221, 222, and 223.

The chemical supplier 300 supplies the chemicals to the substrate W. The chemical supplier 300 includes a swing nozzle 311, a swing nozzle arm 313, a swing nozzle supporting rod 315, a swing nozzle driver 317, a spray nozzle 321, a spray nozzle arm 323, a spray nozzle supporting rod 325, a spray nozzle driver 327, a chemical supplying line 331, a chemical storage tank 333, and a pre-dispenser 340.

The swing nozzle 311 ejects the chemicals in a liquid state. An outlet is formed on a bottom of the swing nozzle 311. The swing nozzle arm 313 is formed to be lengthwise in one direction and mounted with the swing nozzle 311 on a fore-end thereof. The swing nozzle arm 313 supports the swing nozzle 311. The swing nozzle arm 313 is mounted with the swing nozzle supporting rod 315 on a rear end thereof. The swing nozzle supporting rod 315 is located below the swing nozzle arm 313 and is disposed perpendicularly to the swing nozzle arm 313.

The swing nozzle driver 317 is provided on a bottom of the swing nozzle supporting rod 315. The swing nozzle driver 317 rotates the swing nozzle supporting rod 315 on a longitudinal axis of the swing nozzle supporting rod 315. Due to the rotation of the swing nozzle supporting rod 315, the swing nozzle arm 313 and the swing nozzle 311 swing on the swing nozzle supporting rod 315. The swing nozzle 311 may swing between the outside and the inside of the container 210. Also, the swing nozzle 311 may eject the chemicals while swinging between a center and an edge area of the substrate W.

The spray nozzle 321 sprays the chemicals. The chemicals are supplied to an outlet through the chemical supplying line 322. The chemicals sprayed from the outlet spread widely as fine particles into the air. The sprayed chemicals may spread to an ejection area corresponding to or smaller than a radius of the substrate W. The chemicals supplied to the spray nozzle 321 may be controlled in amount of flow and maintains an independent flow path to the outlet. The spray nozzle 321 may be definitely cut off after spraying the chemicals, thereby preventing chemical drops to the substrate W.

Figure 3:
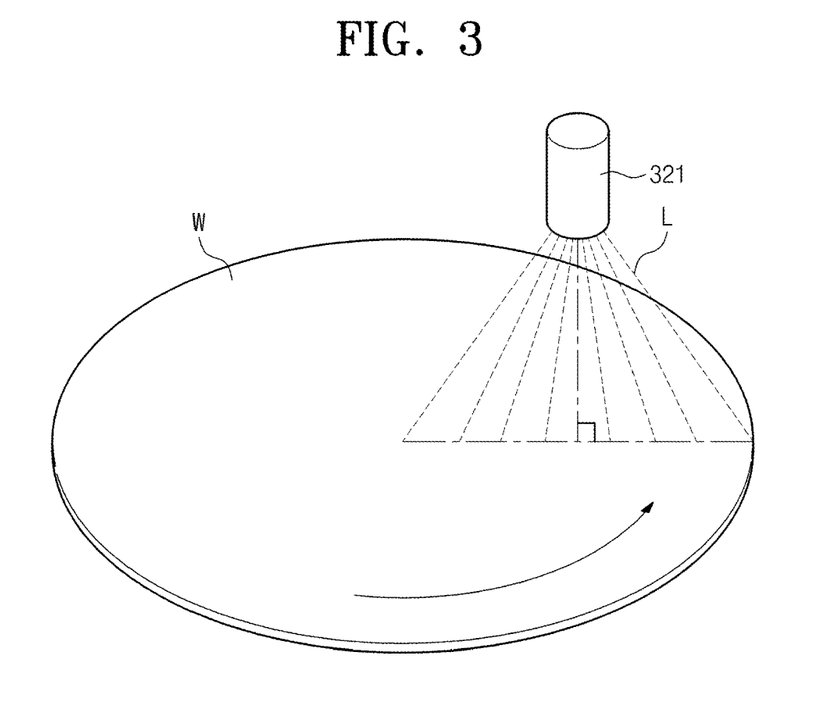
FIG. 3 is a view illustrating spray nozzle arrangements according to an embodiment of the present invention.

FIG. 3 is a view illustrating spray nozzle arrangements according to an embodiment of the present invention.

Referring to FIG. 3, the spray nozzle 321 stands perpendicularly to a top surface of the substrate W and sprays chemicals L. An incidence angle of the chemicals L is perpendicular to the top surface of the substrate W.

Figure 4:
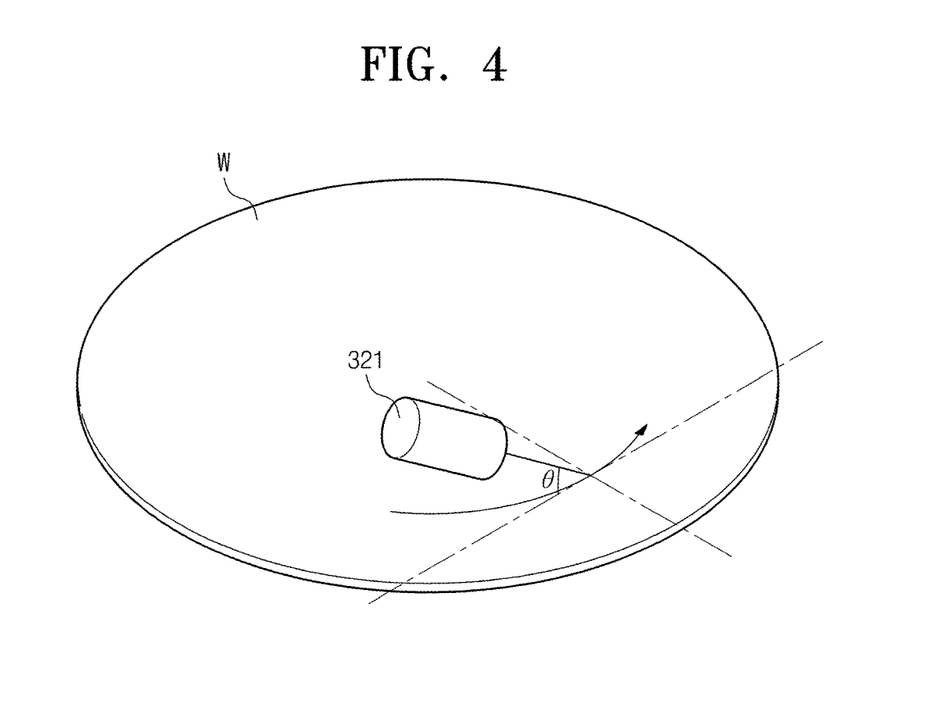
FIG. 4 is a view illustrating spray nozzle arrangements according to another embodiment of the present invention.

FIG. 4 is a view illustrating spray nozzle arrangements according to another embodiment of the present invention.

Referring to FIG. 4, the spray nozzle 321 may be disposed above the substrate W in a tangential direction to a rotational direction of the substrate W from a top view. In this case, the spray nozzle 321 may be disposed to be inclined downwards toward the rotational direction of the substrate W. A longitudinal direction of the spray nozzle 321 forms an acute angle with the top surface of the substrate W. The incidence angle of the sprayed chemicals forms an acute angle with the top surface of the substrate W.

Referring to FIG. 2, the spray nozzle arm 323 is provided lengthwise in one direction and mounted with the spray nozzle 321 on a fore-end thereof. The spray nozzle arm 323 supports the spray nozzle 321. The spray nozzle supporting rod 325 is mounted on a rear end of the spray nozzle arm 323. The spray nozzle supporting rod 325 is located below the spray nozzle arm 323 and is disposed perpendicularly to the spray nozzle arm 323.

The spray nozzle driver 327 is provided on a bottom of the spray nozzle supporting rod 325. The spray nozzle driver 327 rotates the spray nozzle supporting rod 325 on a longitudinal axis of the spray nozzle supporting rod 325. Due to the rotation of the spray nozzle supporting rod 325, the spray nozzle arm 323 and the spray nozzle 321 swing on the spray nozzle supporting rod 325. The swing nozzle 321 may swing between the outside and the inside of the container 210.

Figure 5:
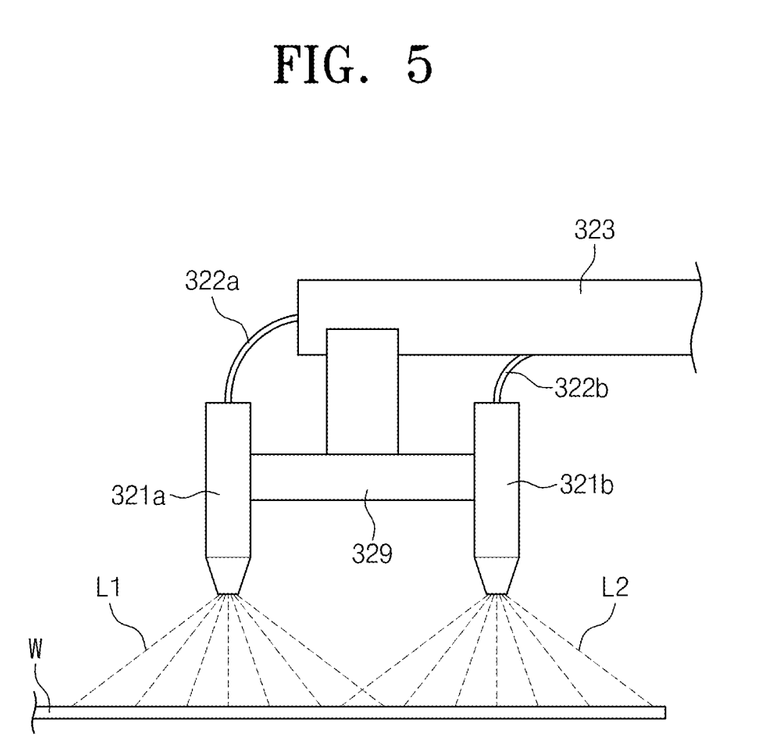
FIG. 5 is a view illustrating spray nozzles according to still another embodiment of the present invention.

FIG. 5 is a view illustrating spray nozzle arrangements according to still another embodiment of the present invention.

Referring to FIG. 5, the spray nozzle arm 323 is mounted with two spray nozzles 321a and 321b on the fore-end. The first spray nozzle 321a and the second spray nozzle 321b are supported by both ends of a connecting rod 329 and are disposed to be aligned with each other. Chemicals L1 are supplied to the first spray nozzle 321a through a first supplying line 322a, and chemicals L2 are supplied to the second spray nozzle 321b through a second supplying line 322b. The chemicals L1 and L2 are sprayed through outlets of the first spray nozzle 321a and the second spray nozzle 321b. Since the chemicals L1 and L2 are supplied to the outlets through independent flow paths, the first spray nozzle 321a and the second spray nozzle 321b are definitely cut off after spraying the chemicals L1 and L2. This prevents chemical drops toward the substrate W after spraying the chemicals L1 and L2.

Figure 6:
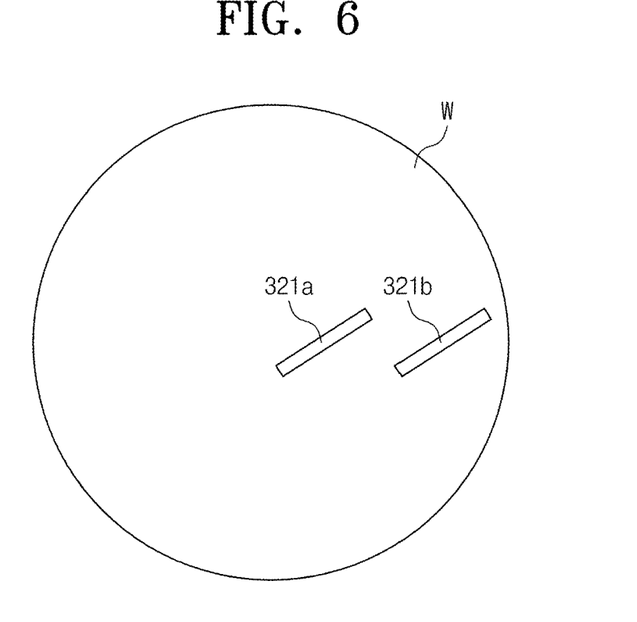
FIG. 6 is a view of arranging first and second spray nozzles according to an embodiment of the present invention.
Figure 7:
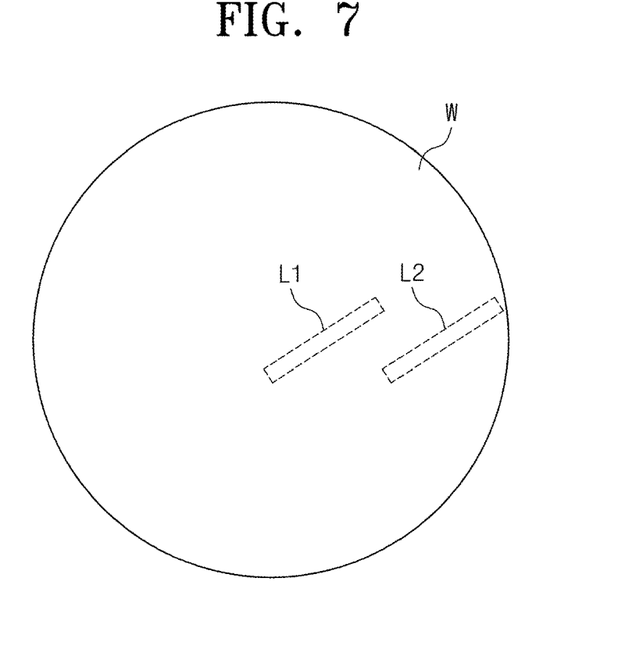
FIG. 7 is a view of ejecting lines formed on a substrate by chemicals sprayed from the nozzles of FIG. 6.

FIG. 6 is a view of arranging the first and second spray nozzles 321a and 321b according to an embodiment of the present invention. FIG. 7 is a view of ejecting lines formed on the substrate by chemicals sprayed from the first and second nozzles 321a and 321b of FIG. 6.

Referring to FIGS. 6 and 7, the first spray nozzle 321a and the second spray nozzle 321b are alternately disposed to allow chemical ejecting lines L1 and L2 to be disposed on mutually different straight lines. The first spray nozzle 321a forms the chemical ejecting line L1 adjacently to the center of the substrate W, and the second spray nozzle 321b forms the chemical ejecting line L2 adjacently to the edge of the substrate W.

The chemical ejecting line L1 formed by the first spray nozzle 321a and the chemical ejecting line L2 formed by the second spray nozzle 321b may be disposed in parallel. Chemicals sprayed from the first and second nozzles 321a and 321b spread in longitudinal directions of the chemical ejecting lines L1 and L2, thereby supplying the chemicals to the substrate W with a width greater than lengths of the first and second nozzles 321a and 321b. Since the first spray nozzle 321a and the second spray nozzle 321b are alternately disposed on the mutually different straight lines, the chemical ejecting lines L1 and L2 may not be overlapped.

Figure 8:
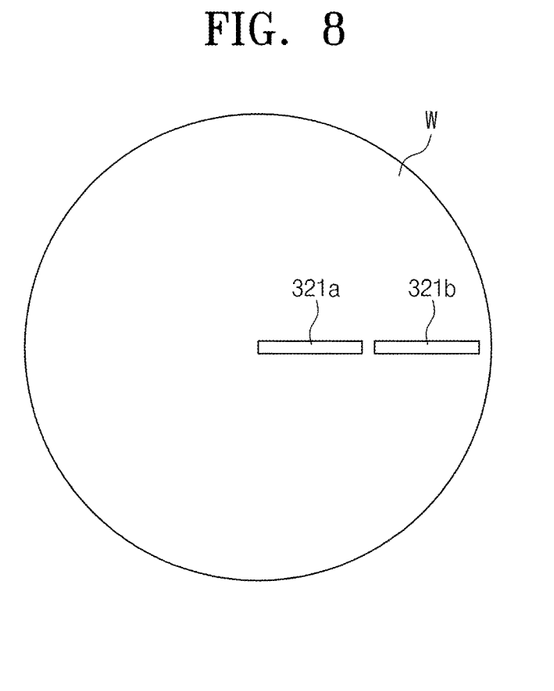
FIG. 8 is a view of arranging first and second spray nozzles according to another embodiment of the present invention.
Figure 9:
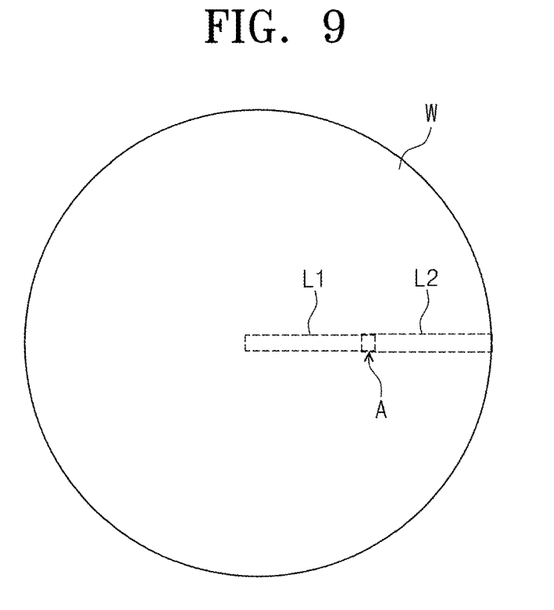
FIG. 9 is a view of ejecting lines formed on the substrate by chemicals sprayed from the nozzles of FIG. 8.

FIG. 8 is a view of arranging the first and second spray nozzles 321a and 321b according to another embodiment of the present invention, and FIG. 9 is a view of ejecting lines formed on the substrate by chemicals sprayed from the nozzles of FIG. 9.

Referring to FIGS. 8 and 9, the first spray nozzle 321a and the second spray nozzle 321b are disposed on a straight line to allow chemical ejecting lines L1 and L2 to be disposed on the same straight line. The first spray nozzle 321a and the second spray nozzle 321b may be disposed on a straight line in a radial direction of the substrate W. The first spray nozzle 321a forms the chemical ejecting line L1 adjacently to the center of the substrate W, and the second spray nozzle 321b forms the chemical ejecting line L2 adjacently to the edge of the substrate W. In this case, while chemicals sprayed from the respective nozzles 321a and 321b are being supplied to the substrate W, the chemical ejecting lines L1 and L2 are partially overlapped. An area A, in which the chemical ejecting lines L1 and L2 are overlapped, exists between the first spray nozzle 321a and the second spray nozzle 321b, in which particles of the chemicals collide with one another. In the area A, cleaning of the substrate W is not well performed and a large amount of mist may occur.

Figure 10:
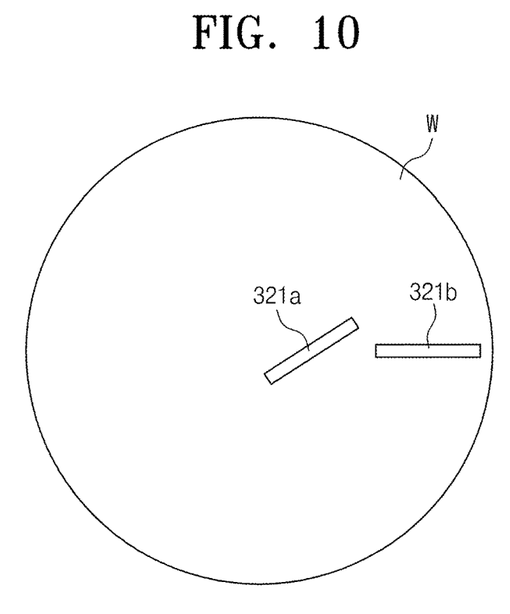
FIG. 10 is a view of arranging first and second spray nozzles according to still another embodiment of the present invention.
Figure 11:
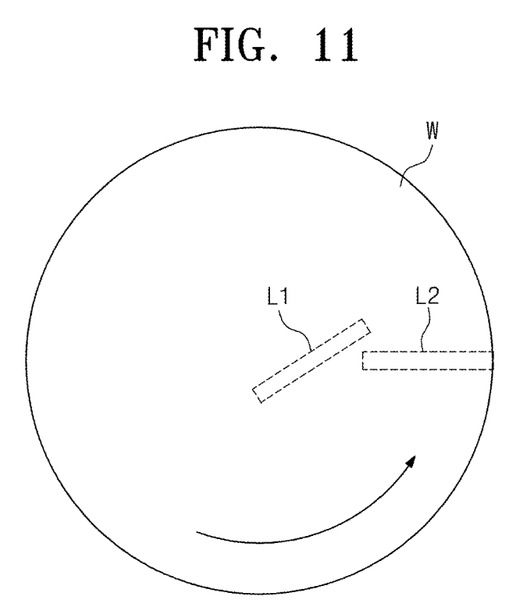
FIG. 11 is a view of ejecting lines formed on the substrate by chemicals sprayed from the nozzles of FIG. 10.

FIG. 10 is a view of arranging the first and second spray nozzles 321a and 321b according to still another embodiment of the present invention, and FIG. 11 is a view of ejecting lines formed on the substrate W by chemicals sprayed from the nozzles 321a and 321b of FIG. 10.

Referring to FIGS. 10 and 11, the first spray nozzle 321a and the second spray nozzle 321b are disposed to form a certain angle based on the center of the substrate W. The first spray nozzle 321a and the second spray nozzle 321b may be disposed collinearly with the radius of the substrate W, respectively. The first spray nozzle 321a is located adjacently to the center of the substrate W, and the second spray nozzle 321b is located adjacently to the edge of the substrate W. Since a chemical ejecting line L1 formed by the first spray nozzle 321a and a chemical ejecting line L2 formed by the second spray nozzle 321b are alternately disposed, the chemical ejecting lines L1 and L2 are not overlapped.

Referring to FIGS. 1 and 2, one end of the chemical supplying line 331 is connected to the chemical storage tank 333 and another end thereof is divided into two connected to the swing nozzle 311 and the spray nozzle 321, respectively. The chemicals stored in the chemical storage tank 333 are supplied to the swing nozzle 311 and the spray nozzle 321, respectively, through the chemical supplying line 331. The swing nozzle 311 and the spray nozzle 321 supply the same chemicals to the substrate W.

The pre-dispenser 340 is located outside the container 210 on a movement path of the spray nozzle 321. The spray nozzle 321, before spraying the chemicals to the substrate W, discharges residual chemicals in the chemical supplying line 331 and chemicals newly supplied to the chemical supplying line 331 into the pre-dispenser 340 for a certain initial time. The residual chemicals in the chemical supplying line 331 and the initially supplied chemicals are maintained at a temperature lower than a process temperature. The spray nozzle 321 ejects the chemicals into the pre-dispenser 340 for the certain time, thereby supplying chemicals maintained at the process temperature to the substrate W.

Figure 12:
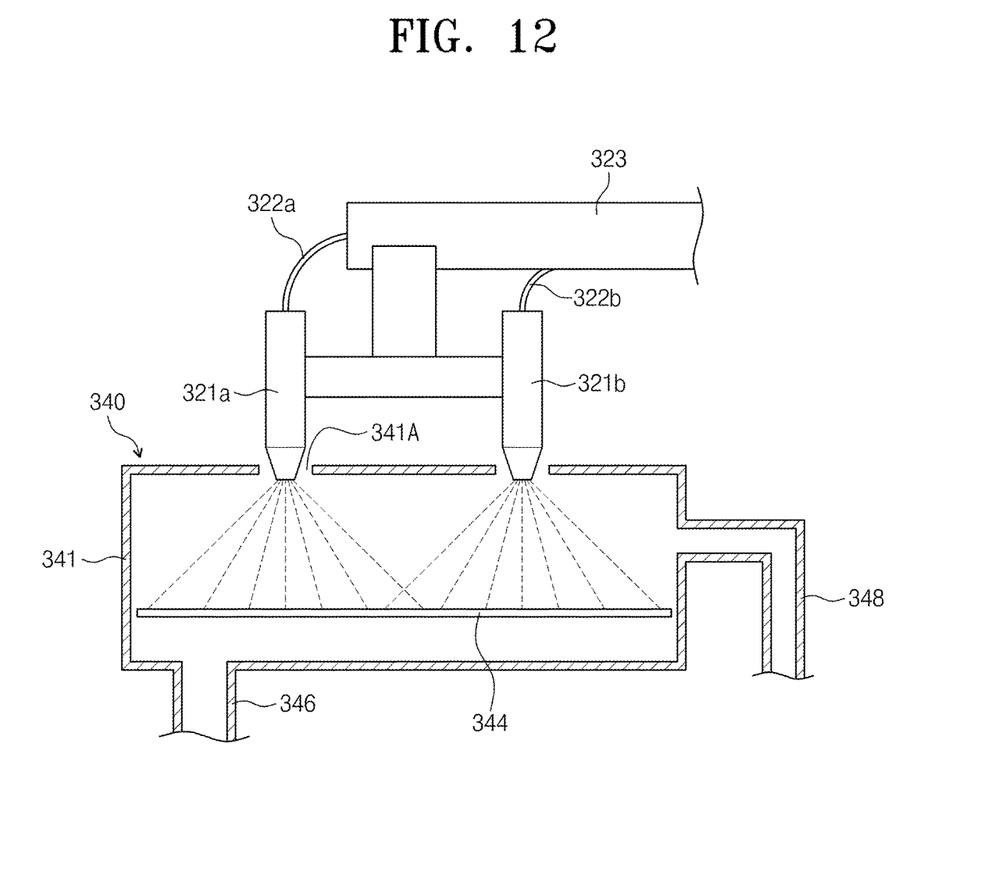
FIG. 12 is a cross-sectional view of a pre-dispenser of FIG. 1.

FIG. 12 is a cross-sectional view of the pre-dispenser 340.

Referring to FIG. 12, the pre-dispenser 340 includes a housing 341, a mesh 344, a discharge line 346, and an exhaust port 348.

The housing 341 is formed with a space therein and is formed with holes 341a on a top. The holes 341a are spaces inserted with the spray nozzles 321a and 321b and formed corresponding to the number of the spray nozzles 321a and 321b. The mesh 344 is provided in the housing 341. The mesh 344 is formed with fine holes. The discharge line 346 is connected to a bottom of the housing 341 and allows chemicals ejected into the housing 341 to be discharged outwards. The exhaust port 348 is connected to a sidewall of the housing 341 and allows fumes occurring in the housing 341 to be exhausted outwards.

The spray nozzles 321a and 321b are inserted into the holes 341a and eject the chemicals for a certain time while an outlet is located inside the housing 341. A hitting force of the chemicals is dispersed while the chemicals are colliding with the mesh 344. A spatter of the chemicals is reduced due to the mesh 344. The fumes occurring in the housing 341 while the chemicals are being ejected are exhausted outwards through the exhaust port 348. Reverse-pollution of the outlets of the nozzles 321a and 321b may be prevented by the mesh 344 and the exhaust port 348. The chemicals ejected into the housing 341 are discharged outwards through the discharge line 346.

The DI water supplier 400 supplies DI water to the substrate W treated with the chemicals. Residual chemicals on the substrate W are replaced by the DI water. The DI water supplier 400 includes a DI spray nozzle 410 spraying the DI water. The DI spray nozzle 410 may be fixed to and installed on the top of the container 210. The DI water spray nozzle 410 may be provided as a plurality thereof to spray the DI water to the rotating substrate W.

The drying gas supplier 500 supplies a drying gas to the substrate W after supplying the DI water. The drying gas supplier 500 includes a gas injection nozzle 510 injects the drying gas and a supporting arm 520 supporting the gas injection nozzle 510. The gas injection nozzle 510 supplies the drying gas while swinging due to rotations of the supporting arm 520.

Figure 13:
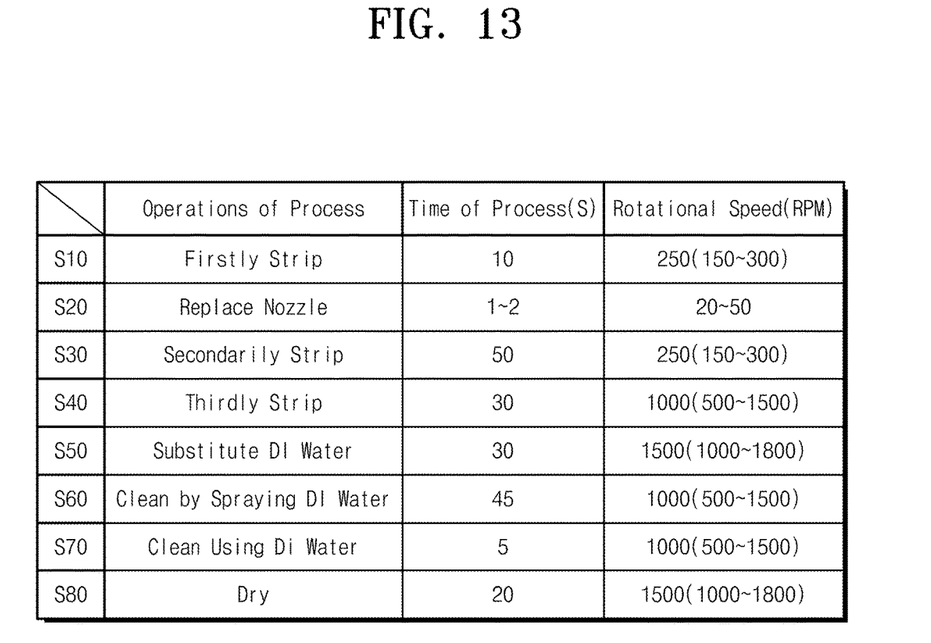
FIG. 13 is a table illustrating a method of treating a substrate according to an embodiment of the present invention.

FIG. 13 is a table illustrating a method of treating a substrate according to an embodiment of the present invention.

Referring to FIG. 13, the method includes performing a cleaning process. In the present embodiment, a process of removing a photoresist (PR) film applied to the substrate W will be described as an example. The cleaning process is performed after performing an etching process and an ashing process. The cleaning process includes a plurality of operations. In the embodiment, the cleaning process includes firstly stripping (S10), replacing nozzles (S20), secondarily stripping (S30), thirdly stripping (S40), substituting DI water (S50), cleaning by spraying the DI water (S60), cleaning using the DI water (S70), and drying (S80), which are sequentially performed.

Figure 14:
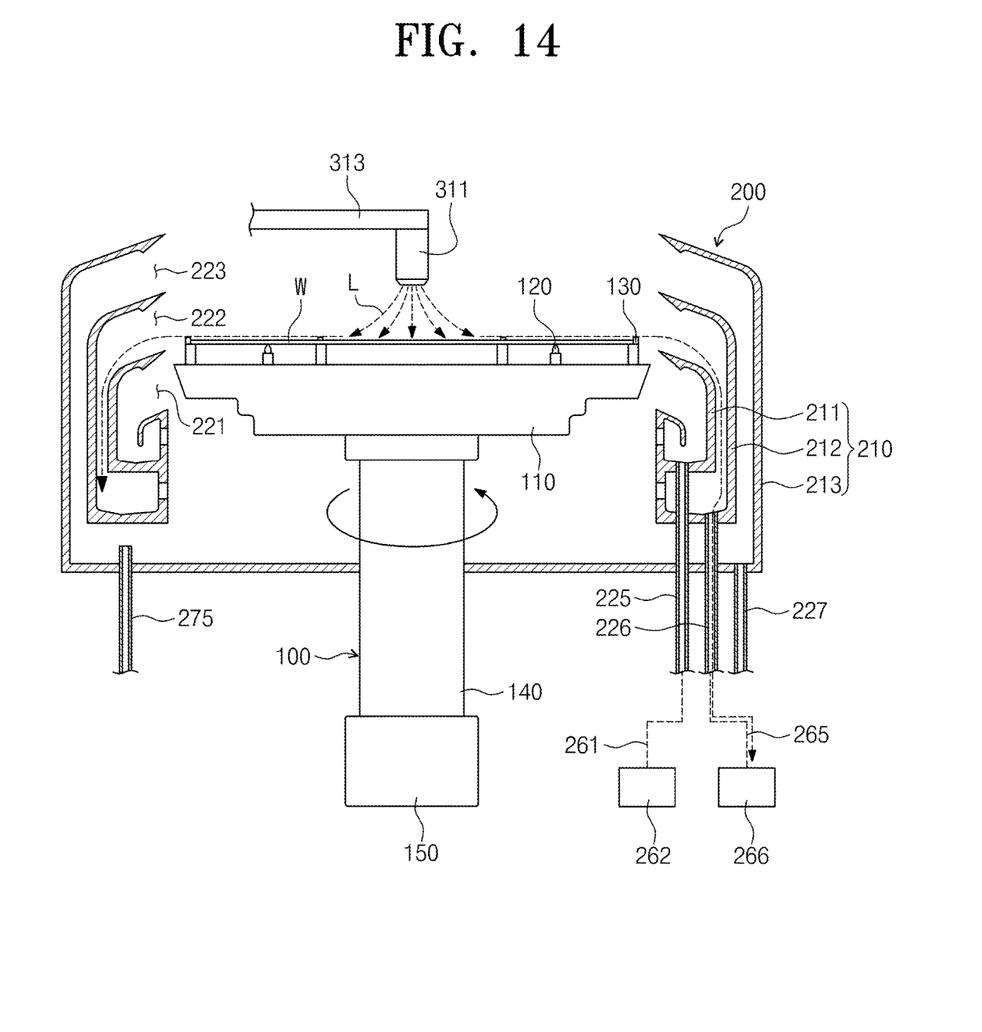
FIG. 14 is a view illustrating firstly stripping according to an embodiment of the present invention.

FIG. 14 is a view illustrating the firstly stripping of FIG. 13.

Referring to FIGS. 13 and 14, in the firstly stripping (S10), the container 210 is located at a height to allow the second inlet 222 and the substrate W to corresponding to each other. The substrate W rotates at a certain speed due to driving of the supporting shaft driver 150. The swing nozzle 311 moves to above the substrate W and supplies chemicals L in a liquid state to the substrate W. The chemicals L are supplied as an amount of being fully applied to the entire top surface of the substrate W. The chemicals L may be supplied for about 10 seconds. The chemicals remove a PR film applied to the substrate W. The PR film is removed by a chemical reaction with the chemicals L and a centrifugal force. When the substrate W rotates at a speed, for example, more than 500 RPM, since the chemical reaction is not fully performed, the substrate W rotates at 500 RPM or less. According to the embodiment, the substrate W may rotate at a speed of from about 150 to about 300 RPM. The substrate W may averagely rotate at a speed of about 250 RPM. The chemicals L are scattered due to the rotations of the substrate W, flow into the second inlet 222, and are collected in the second collecting barrel 212. In the firstly stripping, the PR film is mostly removed. According to an experiment, in the firstly stripping (S10), the PR film is removed by about 80% and coarse particles are generated. By-products are included in the chemicals L and collected in the second collecting barrel 212 together with the chemicals L. Since including a large amount of the by-products, it is difficult to reuse the collected chemicals L. The chemicals L flows into the second discharge pipe 226 and are discarded through the waste liquid line 265. In the firstly stripping, fumes occurring in the container 210 are exhausted outwards through the exhaust pipe 275.

When the firstly stripping (S10) is finished, the spray nozzle 321 ejects a part of the chemicals L into pre-dispenser 340. Residual chemicals in the chemical supplying line 322 and initially supplied chemicals are ejected into the housing 341. The spray nozzle 321, after ejecting the part of the chemicals into the pre-dispenser 340, moves to above the substrate W. The swing nozzle 311 returns to a standby location (S20). While the swing nozzle 311 is being replaced by the spray nozzle 321, the supporting shaft driver 150 reduces a rotational speed of the substrate W. According to the embodiment, replacing nozzles is performed for about 1 or 2 seconds and the supporting shaft driver 150 reduces the rotational speed of the substrate W at from about 20 to about 50 RPM. Due to reducing the rotational speed of the substrate W, a water film is maintained on a top surface of the substrate W. The water film prevents the top surface of the substrate W from being exposed to the air, thereby preventing drying of the chemicals.

Figure 15:
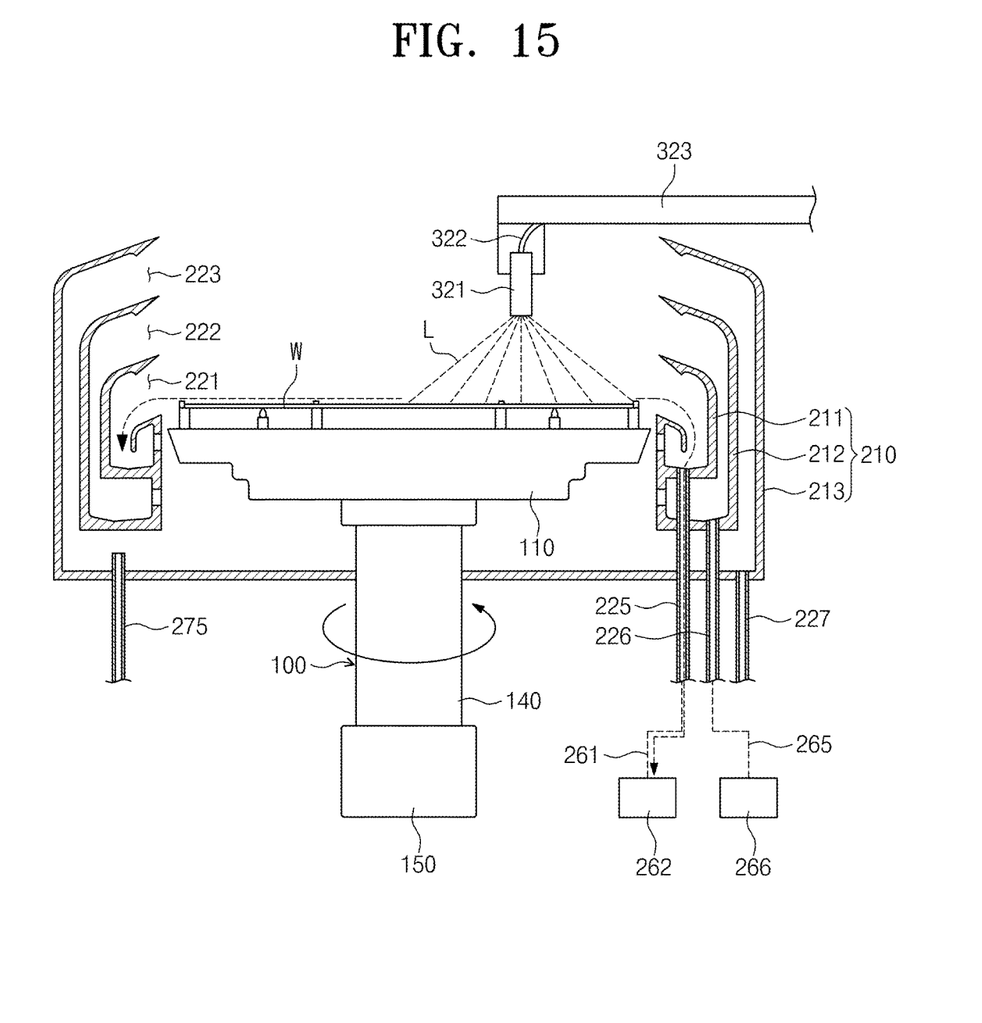
FIG. 15 is a view illustrating secondarily stripping according to an embodiment of the present invention.

FIG. 15 is a view illustrating the secondarily stripping of FIG. 13.

Referring to FIG. 15, in the secondarily stripping (S30), the container 210 is located at a height to allow the first inlet 221 and the substrate W to corresponding to each other. The substrate W may rotate at the same speed as in the firstly stripping (S10). The substrate W may rotate at a speed of from about 150 to about 300 RPM. The substrate W may averagely rotate at a speed of about 250 RPM. In the secondarily stripping (S30), the spray nozzle 321 sprays the chemicals L to the substrate W. The chemicals L may be supplied for a longer time than the firstly stripping (S10). According to the embodiment, the chemicals L may be sprayed for about 50 seconds. Fine particles of the chemicals L physically hit the firstly removed PR film and have a chemical reaction with the PR film. The PR film is removed by a physical hitting force of the fine particles, the chemical reaction therewith, and a centrifugal force. While the PR film is being removed, fine particles of by-products are generated. Since the fine particles of the chemicals L hit the substrate W, a damage does not occur in pattern.

The chemicals L are scattered due to the rotations of the substrate W, flow into the first inlet 221, and are collected in the first collecting barrel 211. The collected chemicals L include a part of the by-products, which may be removable through a recycling process. The chemicals L collected in the first collecting barrel 211 are collected in the chemical collecting tank 262 through the first discharge pipe 225 and the collecting line 261.

After the secondarily stripping (S30), the thirdly stripping (S40) is performed. The container 210 is located at the same height as in the secondarily stripping (S30). The substrate W rotates at a speed faster than the secondarily stripping (S30). The substrate W rotates at from about 500 to about 1500 RPM. The substrate W may averagely rotate at 1000 RPM. The spray nozzle 321 sprays the chemicals L to the substrate W. The chemicals L may be sprayed for a shorter time than the secondarily stripping (S30). The chemicals L may be sprayed for about 30 seconds. The chemicals L remove the residual PR film on the substrate W. The chemicals L may remove a crust layer formed on the PR film through an etching process. The crust layer is formed on the PR film through the etching process, it is not easy to remove in an ashing process.

The PR film and the crust layer are removed by a chemical reaction of the chemicals L, a centrifugal force, and a physical hitting force of particles of the chemicals L. In the thirdly stripping (S40), since the substrate W rotates at a high speed, the centrifugal force and the physical hitting force become strengthened. Due to this, the PR film and the crust layer are easily removed.

The chemicals L are scattered by rotations of the substrate W and flow into the first inlet 221. The chemicals are collected in the first collecting barrel 211, pass through the first discharge pipe 225 and the collecting line 261, and are collected to be reused. The chemicals L used in the secondarily stripping (S30) and the thirdly stripping (S40) are separately collected from the chemicals L used in the firstly stripping (S10) and are independently transferred through the collecting line 261, thereby effectively reusing the chemicals L.

The fumes occurring in the container 210 in the secondarily stripping (S30) and the thirdly stripping (S40) are exhausted outwards through the exhaust pipe 275. In the secondarily stripping (S30) and the thirdly stripping (S40), since the chemicals L are sprayed as fine particles, a large amount of fumes occur in the container 210. The exhaust pipe 275 sucks the fumes by sucking pressure higher than the firstly stripping (S10).

After the thirdly stripping (S40), substituting DI water (S50) is performed. The container 210 is located at a height to allow the third inlet 223 to correspond to the substrate W. The substrate W rotates at a speed faster than the thirdly stripping (S40). The substrate W rotates at from about 1000 to about 1800 RPM. The substrate W may averagely rotate at about 1500 RPM. The DI water supplying nozzle 410 supplies the DI water to the substrate W. The DI water may be supplied for the same time as the thirdly stripping (S40). The DI water may be supplied for about 30 seconds. The DI water is substituted for the residual chemicals L on the substrate W and removes the chemicals L. The DI water is scattered due to rotations of the substrate W, flow into the third inlet 223, and is collected in the third collecting barrel 213.

In the cleaning by spraying the DI water (S60), the DI water is sprayed to the substrate W on which the chemicals L are substituted with the DI water. The substrate W rotates at a lower speed than the substituting the DI water (S50). The substrate W may rotate at from about 500 to about 1500 RPM. The substrate W may averagely rotate at 1000 RPM. The DI water may be supplied for about 45 seconds. Particles of the DI water sprayed to the substrate W remove residual materials and particles on the substrate W.

After finishing the cleaning by spraying the DI water (S60), the cleaning using the DI water (S70) is performed. The substrate W rotates at the same speed as the cleaning by spraying the DI water (S60). The DI water is supplied as a liquid state to the substrate W. The DI water may be supplied for about 5 seconds.

After finishing the cleaning using the DI water (S70), the drying (S80) is performed. The substrate W rotates at a high speed. The substrate W may rotate at a speed of from about 1000 to about 1800 RPM. The substrate W may averagely rotate at a speed of about 1500 RPM. A drying gas is supplied to the rotating substrate W. The drying gas may be supplied for about 20 seconds. The substrate W is dried due to the rotation of the substrate W at the high speed and supplying of the drying gas.

As described above, according to the one or more of the above embodiments of the present invention, chemicals are firstly supplied as a liquid and secondarily supplied by spraying to remove a PR film, thereby reducing an amount of supplied chemicals.

Also, a residual film is effectively removed by a chemical reaction with chemicals, a rotational force of a substrate, and a hitting force of sprayed fine particles.

Also, chemicals used for a primary removal of a PR film and chemicals used for a secondary removal thereof are separately collected, thereby increasing reusability of the chemicals.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A substrate treatment apparatus comprising:
a chuck supporting a substrate and being rotatable;
a container surrounding the chuck and configured to collect chemicals scattered due to rotations of the substrate;
a first spray nozzle configured to spray the chemicals to the substrate;
a spray nozzle driver connected to the first spray nozzle, the spray nozzle driver configured to control the spray nozzle to swing between an outside and an inside of the container;
a swing nozzle configured to eject the chemicals as a liquid, the liquid being chemicals identical to the chemicals sprayed on the substrate by the first spray nozzle;
a swing nozzle driver configured to control the swing nozzle independent of the spray nozzle, to swing above a top of the substrate while the chemicals are being ejected;
an arm including the first spray nozzle on a fore-end thereof;
a second spray nozzle on the fore-end of the arm together with the first spray nozzle, the second spray nozzle configured to spray the chemicals as fine particles through a mesh on the second spray nozzle, the mesh formed with fine holes, the chemicals being identical to the chemicals sprayed on the substrate by the first spray nozzle;
a chemical storage tank configured to supply the chemicals to the swing nozzle, the first spray nozzle, and the second spray nozzle; and
a chemical supply line having a first end and a second end, the first end being connected to the chemical storage tank, the second end being divided into a third divided end and a fourth divided end, the third divided end connected to the swing nozzle, the fourth divided end being connected to at least one of the first spray nozzle or the second spray nozzle.

2. The apparatus of claim 1, wherein the first spray nozzle and the second spray nozzle are on a straight line and are configured to allow a line of chemicals sprayed from the first spray nozzle to be on a same straight line as a line of chemicals sprayed from the second spray nozzle.

3. The apparatus of claim 1, wherein the first spray nozzle and the second spray nozzle are alternately configured to allow a straight line of chemicals ejected from the first spray nozzle to be on a different straight line from a straight line of chemicals ejected from the second spray nozzle.

4. The apparatus of claim 1, wherein the first spray nozzle is configured to spray the chemicals on an ejection area corresponding to or smaller than a radius of the substrate.

5. The apparatus of claim 1, wherein the first spray nozzle is configured to allow an incidence angle of the chemicals sprayed to the substrate to be perpendicular to a top surface of the substrate.

6. The apparatus of claim 1, wherein the first spray nozzle is configured to allow an incidence angle of the chemicals sprayed to the substrate to form an acute angle with a top surface of the substrate.

7. The apparatus of claim 1, wherein the container comprises,
a first collecting barrel surrounding the chuck and forming a first inlet having a ring shape; and
a second collecting barrel surrounding the first collecting barrel and forming a second inlet having a ring shape above the first inlet,
the apparatus further including,
a collecting line connected to the first collecting barrel and configured to collect the chemicals flowing into the first collecting barrel to reuse the chemicals;
a waste liquid line connected to the second collecting barrel and configured to discard chemicals flowing into the second collecting barrel; and
a controller configured to elevate any one of the chuck and the container to allow the chemicals sprayed from the first spray nozzle to flow through the first inlet and to allow the chemicals injected from the swing nozzle to flow through the second inlet.

8. The apparatus of claim 7, further comprising:
an exhaust pipe configured to suck and exhaust outwards fumes occurring in the container,
wherein sucking pressure of the exhaust pipe is greater in a process of spraying the chemicals from the spray nozzle than in a process of spraying the chemicals from the swing nozzle.

9. The apparatus of claim 1, further comprising:
a pre-dispenser outside the container, to which the spray nozzle preliminarily configured to eject the chemicals before ejecting the chemicals to the substrate,
wherein the pre-dispenser includes,
a housing with a space therein and with a hole, into which the spray nozzle is inserted, on a top thereof;
the mesh provided in the housing and configured to disperse a hitting force of the injected chemicals;
a discharge line configured to discharge outwards the chemicals ejected into the housing; and
an exhaust port configured to exhaust outwards fine particles of residual chemicals in the housing.

10. A nozzle assembly comprising:
a swing nozzle configured to supply chemicals in a liquid state to a substrate;
a swing nozzle arm with the swing nozzle on a fore-end thereof and configured to control the swing nozzle to swing;
a swing nozzle driver configured to control the swing nozzle to swing above a top of the substrate while the chemicals are being ejected;
a spray nozzle configured to spray the chemicals as fine particles through a mesh on the spray nozzle, the mesh formed with fine holes, the chemicals being identical to the chemicals supplied as a liquid state to the substrate by the swing nozzle;
a spray nozzle arm with the spray nozzle on a fore-end thereof;
a chemical storage tank configured to supply the chemical to the swing nozzle and the spray nozzle;
a spray nozzle driver connected to the spray nozzle and configured to control the spray nozzle independent of the swing nozzle, and configured to swing between an outside and an inside of a container; and
a chemical supply line having a first end and a second end, the first end being connected to the chemical storage tank, the second end being divided into a third divided end and a fourth divided end, the third divided end connected to the swing nozzle, the fourth divided end connected to the spray nozzle, wherein
the spray nozzle comprises a first spray nozzle and a second spray nozzle, the first spray nozzle and the second spray nozzle being on the fore-end of the spray nozzle arm, and
the first spray nozzle and the second spray nozzle are configured to spray chemicals as fine particles.

11. The nozzle assembly of claim 10,
wherein the first spray nozzle and the second spray nozzle are configured to not to allow ejection areas of the chemicals to be overlapped.

12. The nozzle assembly of claim 10, wherein the spray nozzle is configured to allow an ejecting line of the chemicals to be perpendicular to a top surface of the substrate.

13. The nozzle assembly of claim 10, wherein the spray nozzle is configured to allow an ejecting line of the chemicals to form an acute angle with a top surface of the substrate.

14. A substrate treatment apparatus comprising:
a chuck supporting a substrate and being rotatable;
a container surrounding the chuck and configured to collect chemicals scattered due to rotations of the substrate;
a first spray nozzle configured to spray the chemicals as fine particles to the substrate through a mesh on the first spray nozzle, the mesh formed with fine holes;
a spray nozzle driver connected to the first spray nozzle, the spray nozzle driver configured to control the spray nozzle to swing around a first axis, and to swing between an outside and an inside of the container;
a swing nozzle configured to eject the chemicals as a liquid, the chemicals ejected as a liquid being identical to the chemicals sprayed as fine particles on the substrate;
a swing nozzle driver configured to control the swing nozzle to swing around a second axis different from the first axis, and to swing above a top of the substrate while the chemicals are being ejected;
an arm including the first spray nozzle on a fore-end thereof;
a second spray nozzle on the fore-end of the arm together with the first spray nozzle, the second spray nozzle configured to spray the chemicals as fine particles, the fine particles being chemicals identical to the chemicals sprayed on the substrate by the first spray nozzle;
a chemical storage tank configured to supply the chemical to the swing nozzle, the first spray nozzle, and the second spray nozzle; and
a chemical supply line having a first end and a second end, the first end being connected to the chemical storage tank, the second end being divided into a third divided end and a fourth divided end, the third divided end connected to the swing nozzle, the fourth divided end connected to the spray nozzle.

15. The apparatus of claim 14, wherein the first spray nozzle and the second spray nozzle are on a straight line and are configured to allow a line of chemicals sprayed from the first spray nozzle to be on the same straight line as a line of chemicals sprayed from the second spray nozzle.

16. The apparatus of claim 14, wherein the first spray nozzle and the second spray nozzle are alternately configured to allow a straight line of chemicals ejected from the first spray nozzle to be on a different straight line from a straight line of chemicals ejected from the second spray nozzle.

17. The apparatus of claim 14, wherein the first spray nozzle is configured to spray the chemicals on an ejection area corresponding to or smaller than a radius of the substrate.

18. The apparatus of claim 14, wherein the first spray nozzle is configured to allow an incidence angle of the chemicals sprayed to the substrate to be perpendicular to a top surface of the substrate.

19. The apparatus of claim 14, wherein the first spray nozzle is configured to allow an incidence angle of the chemicals sprayed to the substrate to form an acute angle with a top surface of the substrate.

20. The apparatus of claim 19, further comprising:
an exhaust pipe configured to suck and exhaust outwards fumes occurring in the container,
wherein sucking pressure of the exhaust pipe is greater in a process of spraying the chemicals from the spray nozzle than in a process of spraying the chemicals from the swing nozzle.

21. The apparatus of claim 14, wherein the container comprises,
a first collecting barrel surrounding the chuck and forming a first inlet having a ring shape; and
a second collecting barrel surrounding the first collecting barrel and forming a second inlet having a ring shape above the first inlet,
the apparatus further including,
a collecting line connected to the first collecting barrel and configured to collect chemicals flowing into the first collecting barrel to reuse the chemicals;
a waste liquid line connected to the second collecting barrel and configured to discard chemicals flowing into the second collecting barrel; and
a controller configured to elevate any one of the chuck and the container to allow the chemicals sprayed from the first spray nozzle to flow through the first inlet and to allow the chemicals injected from the swing nozzle to flow through the second inlet.

22. The apparatus of claim 14, further comprising:
a pre-dispenser outside the container, to which the spray nozzle preliminarily configured to eject the chemicals before ejecting the chemicals to the substrate,
wherein the pre-dispenser includes,
a housing with a space therein and with a hole, into which the spray nozzle is inserted, on a top thereof;
the mesh provided in the housing and configured to disperse a hitting force of the injected chemicals;
a discharge line configured to discharge outwards the chemicals ejected into the housing; and
an exhaust port configured to exhaust outwards fine particles of residual chemicals in the housing.

* * * * *